US010626494B2

(12) United States Patent
Yakushiji et al.

(10) Patent No.: US 10,626,494 B2
(45) Date of Patent: Apr. 21, 2020

(54) PLASMA CVD APPARATUS AND VACUUM TREATMENT APPARATUS

(71) Applicant: CANON ANELVA CORPORATION, Kawasaki-shi (JP)

(72) Inventors: Hiroshi Yakushiji, Kawasaki (JP);
Masahiro Shibamoto, Kawasaki (JP);
Kazuto Yamanaka, Kawasaki (JP);
Shogo Hiramatsu, Kawasaki (JP);
Susumu Karino, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 613 days.

(21) Appl. No.: 14/107,005

(22) Filed: Dec. 16, 2013

(65) Prior Publication Data

US 2014/0174355 A1    Jun. 26, 2014

(30) Foreign Application Priority Data

Dec. 20, 2012    (JP) .................................. 2012-278183

(51) Int. Cl.
*C23C 16/50*        (2006.01)
*C23C 14/56*        (2006.01)
(Continued)

(52) U.S. Cl.
CPC ............ *C23C 14/568* (2013.01); *C23C 16/26* (2013.01); *C23C 16/4401* (2013.01); *C23C 16/509* (2013.01); *G11B 5/85* (2013.01)

(58) Field of Classification Search
CPC . C23C 14/568; C23C 16/4401; C23C 16/509; C34C 16/26; G11B 5/85
See application file for complete search history.

(56) References Cited

U.S. PATENT DOCUMENTS 5,254,236 A * 10/1993 Kinokiri ............... C23C 14/042
                                                       204/192.12
6,176,932 B1    1/2001 Watanabe et al.
(Continued)

FOREIGN PATENT DOCUMENTS

JP          3299721 B2     4/2002
JP       2002-313737 A    10/2002
(Continued)

OTHER PUBLICATIONS

Yakushiji et al. Machine Translation of JP2002313737 by JPO obtained Feb. 13, 2017.*
(Continued)

*Primary Examiner* — Yuechuan Yu
(74) *Attorney, Agent, or Firm* — Venable LLP

(57) ABSTRACT

In one embodiment of the invention, a protective film formation chamber for forming a carbon protective film on a magnetic film includes: a gas introduction part which introduces a source gas to a vacuum vessel; a discharge electrode having a discharge surface at a position facing a substrate conveyed to a predetermined position in the vacuum vessel; a plasma formation part which applies voltage between the discharge surface and the substrate conveyed to the predetermined position; a permanent magnet being provided on a back side of the discharge surface and having a first magnet and a second magnet provided such that their magnetic poles facing the discharge surface are opposite to each other; and a no-erosion-portion mask being provided in parallel to the discharge surface and covering an area of the discharge surface surrounding a portion facing the permanent magnet.

11 Claims, 8 Drawing Sheets

(51) Int. Cl.
*C23C 16/509* (2006.01)
*C23C 16/44* (2006.01)
*C23C 16/26* (2006.01)
*G11B 5/85* (2006.01)

(56) References Cited

U.S. PATENT DOCUMENTS

| | | | |
|---|---|---|---|
| 6,228,439 B1 | 5/2001 | Watanabe et al. | |
| 6,523,493 B1* | 2/2003 | Brcka | H01J 37/321 |
| 2002/0129769 A1* | 9/2002 | Kim | C23C 16/45514 |
| | | | 118/723 E |
| 2002/0129903 A1* | 9/2002 | Davis | H01J 37/32082 |
| | | | 156/345.48 |
| 2004/0149699 A1* | 8/2004 | Hofman | H01J 37/32183 |
| | | | 219/121.43 |
| 2005/0031797 A1 | 2/2005 | Matsuyama | |
| 2010/0294656 A1* | 11/2010 | Ikeda | H01J 37/32091 |
| | | | 204/298.11 |
| 2011/0147200 A1* | 6/2011 | Hirayanagi | H01J 27/024 |
| | | | 204/192.34 |
| 2013/0264194 A1 | 10/2013 | Xu et al. | |
| 2013/0269607 A1 | 10/2013 | Xu et al. | |
| 2013/0273263 A1 | 10/2013 | Xu et al. | |

FOREIGN PATENT DOCUMENTS

| | | |
|---|---|---|
| JP | 3547202 B2 | 4/2004 |
| JP | 2005-23403 A | 1/2005 |
| JP | 4268234 B2 | 2/2009 |
| JP | 4567867 B2 | 8/2010 |

OTHER PUBLICATIONS

Notification of Reasons for Refusal dated Jul. 7, 2016, in counterpart JP Patent Application No. 2012-278183 (5 pages including translation).

* cited by examiner

PLASMA CVD APPARATUS AND VACUUM TREATMENT APPARATUS

CROSS-REFERENCE TO RELATED APPLICATIONS

This application claims the benefit of Japanese Patent Application No. 2012-278183, filed Dec. 20, 2012. The contents of the aforementioned application are incorporated herein by reference in its entirety.

BACKGROUND OF THE INVENTION

Field of the Invention

The present invention relates to a plasma CVD apparatus and a vacuum treatment apparatus, and particularly to a plasma CVD apparatus configured to form a carbon protective film of a magnetic recording medium and a vacuum treatment apparatus using the plasma CVD apparatus.

Description of the Related Art

There are high needs for a higher-capacity recording device such as a magnetic hard disk drive (HDD), and therefore demands exist for an increase in the areal recording density of a magnetic recording medium. The recording density of a magnetic recording medium depends on factors such as the characteristics of a magnetic film of the magnetic recording medium (such as coercive force and film thickness), the characteristics of a magnetic head (such as frequency characteristics and gap length), and spacing between the magnetic film of the magnetic recording medium and the magnetic head (referred to below as the "magnetic spacing"). Hence, the recording density can be increased bye for example, decreasing the film thickness of a protective film on the magnetic recording medium to reduce the magnetic spacing or decreasing in the medium noise caused by reducing magnetization inversion of the magnetic recording medium.

Nowadays, a recording and reproducing technique employed by a hard disk drive is mainly perpendicular magnetic recording. A magnetic recording medium used in the perpendicular magnetic recording includes: a rigid, non-magnetic substrate ouch as a glass substrate or a substrate formed by aluminum-alloy plated with nickel-phosphorus; and on the non-magnetic substrate, a multi-layered film including an adhesion layer, a soft magnetic layer, an intermediate layer, and a magnetic recording layer. A diamond-like carbon (DLC) protective film is formed on the magnetic recording layer to in order to meet corrosion resistance and product durability. The film thickness of the DLC protective film has been reduced to 5 nm or less. A fluorocarbon-based lubricant is applied onto the DLC protective film to reduce the wear between the magnetic head and the magnetic recording medium.

In a known method, the DLC protective film is formed with chemical vapor deposition (CVD) using plasma of a hydrocarbon gas. Specifically, the DLC protective film is formed by performing CVD film formation in which negative voltage is applied to the substrate, on which the magnetic recording layer is formed, to attract positive ions of hydrocarbon to the substrate.

Japanese Patent Nos. 3299721 and 3547202 disclose hot-filament plasma CVD apparatuses. With the techniques disclosed in Japanese Patent Nos. 3299721 and 3547202, however, the filament easily breaks and has to be replaced every time the filament breaks, which is inconvenient. Various technical improvements have been attempted for an apparatus for forming a DLC protective film without using a filament. For example, Japanese Patent Application Publication No. 2005-23403 discloses a method for forming a DLC protective film by using a high-frequency plasma CVD method. The technique disclosed in Japanese Patent Application Publication No. 2005-23403, however, poses the following inconvenience. Specifically, When DLC protective films are formed successively, hard DLC protective films having nigh internal stress are deposited on a high-frequency voltage-applied electrode due to self-bias effect. Having high internal stress, the DLC protective films are liable to peel off and therefore require short-interval maintenance.

There are also known technical improvements attempted to prevent the peeling of the deposited DLC films. For example, Japanese Patent No. 4268234 discloses an oxygen plasma cleaning technique for periodically removing DLC film deposited in a chamber for forming a protective film. In addition, Japanese Patent No, 4567867 discloses the following technique. Specifically, in addition to the DLC film removal by oxygen plasma cleaning, the surface of a discharge electrode is made of carbon so that impurities other than carbon may not be incorporated into or may not contaminate the protective film. In these techniques, however, the recording and reproducing performance may be degraded because the oxygen gas used in the plasma cleaning contaminates she surface of the magnetic layer. This degradation in performance needs to be prevented.

SUMMARY OF THE INVENTION

The present invention has been made in view of the conventional problems described above, and has an objective of providing a plasma CVD apparatus which is capable of forming a DLC protective film excellent in corrosion resistance and requires low running costs. Another objective is to provide a plasma CVD apparatus regaining no oxygen plasma cleaning process for removing a DLC film deposited in a protective film formation chamber, and being capable of reducing particles generated in the protective film formation chamber.

A plasma CCD apparatus of the present invention includes: a vacuum vessel; a gas introduction part configured to introduce a process gas to the vacuum vessel; a discharge electrode part having a discharge surface at a position facing a substrate conveyed to a predetermined position in the vacuum vessel; a plasma formation part configured, to form a plasma between the substrate conveyed to tire predetermined position and the discharge surface; a magnet unit being provided on a back side of the discharge surface and having a first magnet provided such that a certain one of magnetic poles thereof faces the discharge surface and a second magnet provided such that a magnetic pole opposite to the certain magnetic pole of the first magnet faces the discharge surface; and a mask part being provided on a substrate side of the discharge surface, being placed in parallel to the discharge surface, and covering a portion of the discharge surface surrounding an area facing the magnet unit. Further, in a vacuum, treatment apparatus of the present invention, a protective film is formed by the plasma CVD apparatus described above.

As described above, the plasma CVD apparatus of the present invention can reduce generation of particles in the protective film formation chamber due to peering of a DLC film, without performing a DLC film removal process by oxygen-plasma cleaning. Thus, there is no risk that the record and reproduction performance is lowered or degraded by an oxygen-plasma cleaning gas which contaminates the surface of a magnetic film. Moreover, since the discharge electrode is made of carbon, incorporation or contamination of impurities, other than carbon, info a protective film can be reduced.

DESCRIPTION OF TEE EMBODIMENTS

An embodiment of the invention of the present application is described in detail below with reference to the drawings. Note that the present invention is not limited to the embodiment given below, and can be appropriately changed as long as the spirit of the present invention is not changed.

Figure 1:
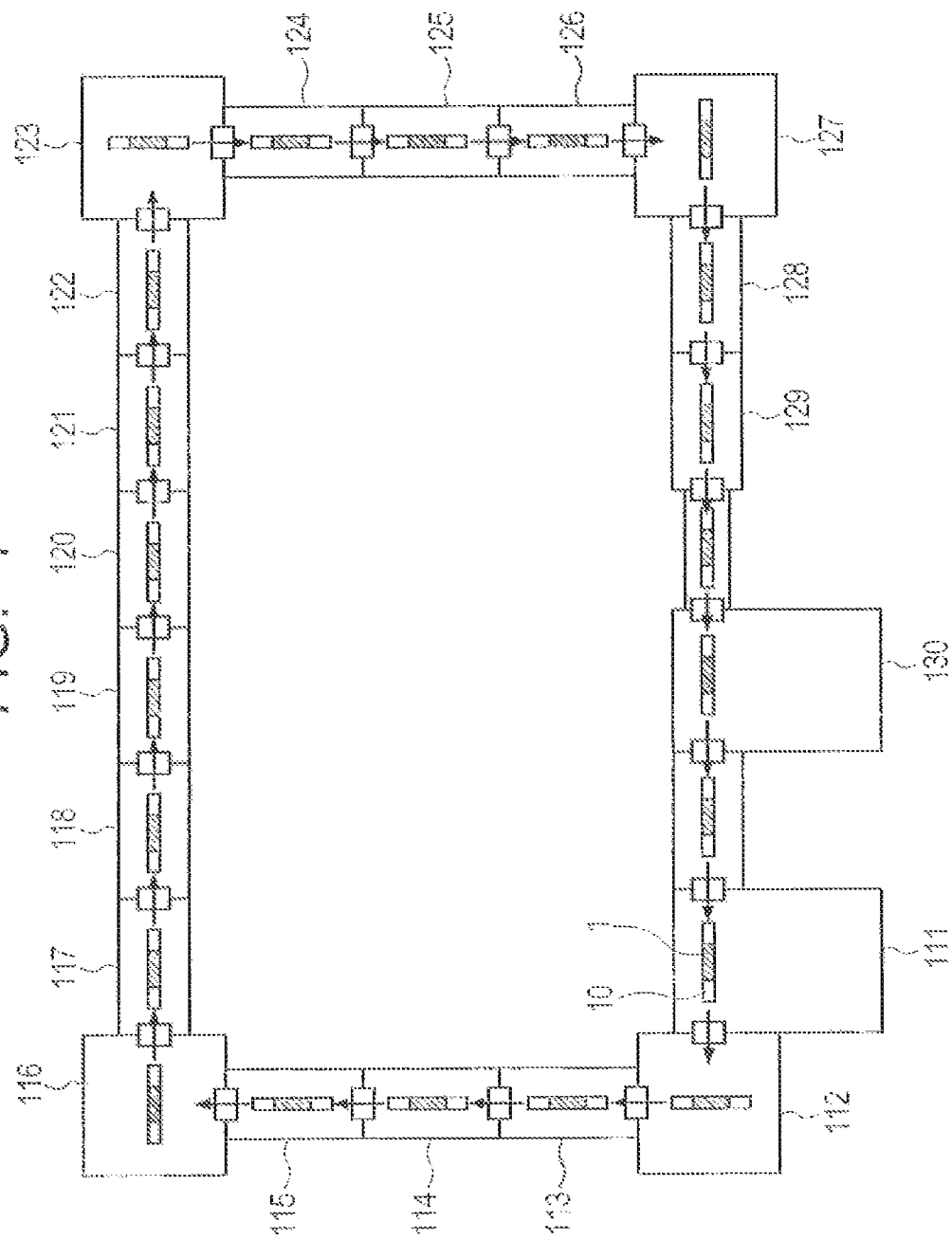
FIG. 1 is a plan view showing the schematic configuration of a film formation apparatus for the magnetic recording medium, according to an embodiment of the invention of the present application.

FIG. 1 is a plan view showing a vacuum treatment apparatus according to this embodiment. The film formation apparatus of this embodiment is an in-line apparatus. An in-line apparatus is an apparatus in which a substrate is conveyed through multiple chambers connected together. The film formation apparatus of this embodiment has multiple chambers 111 to 130 connected to one another in an endless manner. Each of the chambers 111 to 130 is a vacuum vessel configured to be evacuated by a dedicated or shared evacuation system.

The chambers 111 to 130 are connected via gate valves. Each of the chambers 111 to 130 is provided with a conveyer device capable of conveying a carrier 10 via the gate valve. The conveyer device has a conveyance route along which the carrier 10 is conveyed in an upright posture. A substrate 1 is mounted on the carrier 10 and conveyed along the conveyance route (not shown in FIG. 1). The chamber 111 is a load lock chamber where the substrate 1 is mounted on the carrier 10. The chamber 130 is an unload lock chamber where the substrate 1 is collected from the carrier 10. The substrate 1 is a circular disk member made of metal or glass having a hole (inner periphery hole) at a center portion thereof.

The chambers 113 to 129 are treatment chambers for performing various treatments. Specifically, the chamber 113 is an adhesion layer formation chamber for forming an adhesion layer on the substrate 1, the chambers 114, 115, and 117 are soft magnetic layer formation chambers for forming a soft magnetic layer on the substrate 1 on which the adhesion layer has been formed, the chamber 119 is a seed layer formation chamber for forming a seed layer on the substrate 1 on which the soft magnetic layer has been formed, the chambers 120 and 121 are intermediate layer formation chambers for forming an intermediate layer on the substrate 1 on which she seed layer has been formed, the chambers 124 and 125 are magnetic film formation chambers (magnetic recording layer formation chambers) for forming a magnetic film on the substrate 1 on which the intermediate layer has been formed, and the chamber 128 is a protective film formation chamber for forming a protective film on the magnetic film. The chambers 112, 116, 123, and 127 located on the respective corners of the quadrangle are each a direction changing chamber including a direction changing device configured to change the conveyance direction of the substrate 1 by 90°.

A description is given of the configurations of the adhesion layer formation chamber 113, the soft magnetic layer formation chambers 114, 115, and 117, the seed layer formation chamber 119, the intermediate layer formation chambers 120 and 121, and the magnetic film formation chambers 124 and 125. The adhesion layer formation chamber 113, the soft magnetic layer formation chambers 114, 115, and 117, the seed layer formation chamber 119, the intermediate layer formation chambers 120 and 121, and the magnetic film formation chambers 124 and 125 all use a DC magnetron sputtering process to form their films, namely, the adhesion layers the soft magnetic layer, the seed layer, the intermediate layer, and the magnetic recording layer, on the substrate 1. The formation chambers have different target materials, but have basically the same configuration. As an example, the configuration of the magnetic film formation chamber 124 is described.

The magnetic formation chamber 124 has an evacuation system, a gas introduction system which introduces a process gas, a target provided in an internal space of the chamber 124 with its surface to be spattered being exposed, a power source which applies discharge voltage to a cathode electrode (target), and a magnet device provided behind the target. The magnetic film formation chamber 124 is symmetrical with respect to a direction along which the carrier 10 (substrate 1) moves, and capable of simultaneously forming a film on each surface of the substrate 1 held by the carrier 10. While a process gas is being introduced into the magnetic film formation chamber 124, the internal pressure thereof is maintained at a predetermined pressure by the evacuation system. In this state, power is applied by the power source. As a result, discharge takes place, and the target is sputtered. The target material sputtered off reaches the substrate 1, forming a predetermined magnetic film on the surface of the substrate 1. FIG. 1 depicts treatment chambers not described above. These treatment chambers include, for example, a substrate cooling chamber for cooling the substrate 1 and a substrate re-holding chamber for re-holding the substrate 1.

The carrier 10 is capable of holding two substrates 1 at once. The carrier 10 has a holder made of Ni alloys and configured to hold the substrate 1 and a slider configured to support the holder and move on the conveyance route. The carrier 10 can move on the conveyance route in an upright posture. The carrier 10 can support the substrate 1 at several points on an outer peripheral portion of the substrate 1 with multiple members (plate springs) provided to the holder, and therefore can hold the substrate 1 with the film formation surface-thereof facing the target without being shielded.

The conveyer device includes many driven rollers arranged along the conveyance route and a magnetic screw which introduces power to the vacuum side by magnetic coupling. The slider of the carrier 10 includes permanent magnets, and by magnetically coupling the permanent magnets of the slider with the rotating magnetic screw, the slider (carrier 10) is moved along the driven rollers. For example, configurations disclosed in Japanese Patent Application Publication No. Hei 8-274142 can be employed as the configurations of the carrier 10 and the conveyer device. Of course, a conveyer device using a linear motor or a rack and pinion may also be used.

A description is given of a procedure of treating the substrate in the film formation apparatus. First, inside the load lock chamber 111, two untreated substrates 1 are mounted on a first carrier 10. The first carrier 10 moves to the adhesion layer formation chamber 113, where adhesion layers are formed on the substrates 1. Meanwhile, in the load lock chamber 111, another two untreated substrates 1 are mounted on a second carrier 10. After a lapse of one cycle time, the first carrier 10 moves to the soft magnetic layer formation chamber 114, where soft magnetic layers are formed on the substrates 1. Meanwhile, the second carrier 10 moves to the adhesion layer formation, chamber 113, where adhesion layers are formed on tire substrates 1, and another set of substrates 1 is mounted on a third carrier 10 in the load lock chamber 111.

In this way, the carriers 10 move to the adjacent chambers after each cycle time, and an adhesion layer, a soft magnetic layer, a seed layer, an intermediate layer, a magnetic recording layer, and a protective film are sequentially formed. By the DC magnetron sputtering process, the adhesion layer is formed by the adhesion layer formation chamber 113, the soft magnetic layer is formed by the soft magnetic layer formation chambers 114, 115, and 117, the seed layer is formed by the seed layer formation chamber 119, the intermediate layer is formed by the intermediate layer formation chambers 120 and 121, and the magnetic recording layer is formed by the magnetic recording layer formation chambers 124 and 125. The protective film is a DLC film, and is formed, by the protective film formation chamber 128 by a CVD process. Then, after she formation of the protective film, the carrier 10 readies the unload lock chamber 130, where two created substrates 1 are collected from the carrier 10.

Figure 2:
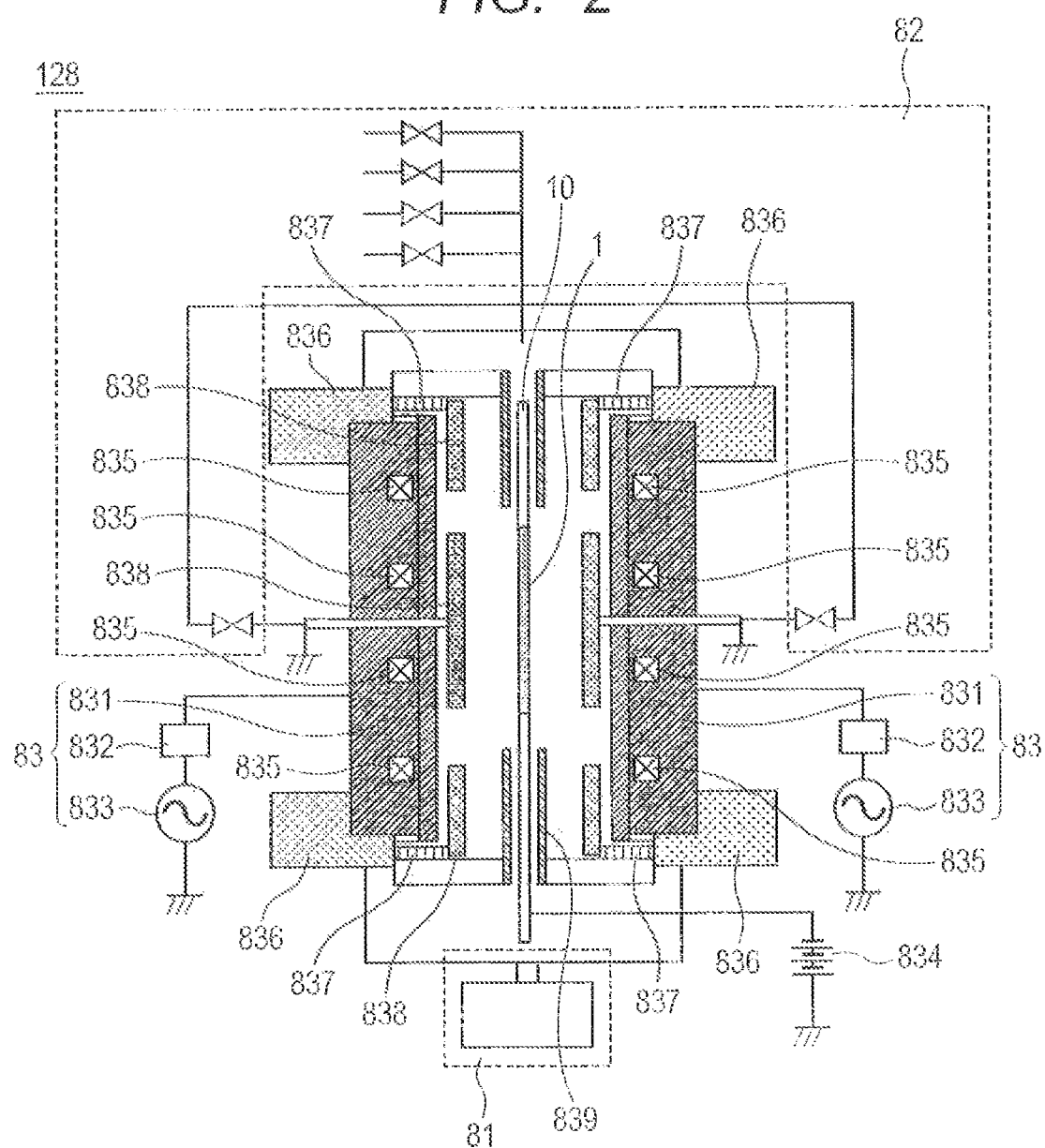
FIG. 2 is a side sectional view schematically showing the configuration of a protective film formation chamber shown in FIG. 1.

FIG. 2 is a schematic sectional view of the protective film formation chamber 128 seen in the moving direction of the carrier 10. Using FIG. 2, a description is given of the protective film formation chamber 128 (a protective film formation apparatus or a plasma CVD apparatus) of the film formation apparatus of this embodiment. The protective film formation chamber 128 is a vacuum vessel (chamber) connected to an evacuation system 81, and is capable of simultaneously forming films on both surfaces of two substrates 1 held by the carrier 10. The substrates 1 are held via the carrier 10 at a predetermined position at the center of the protective film formation chamber 128. The substrates 1 are held by the carrier 10 configured to be moved inside the protective film format ton chamber 128 by the above-described conveyance device. The protective film formation chamber 128 has a configuration which is horizontally symmetrical with respect to the carrier 10 (the substrates 1). The evacuation system 61 includes a vacuum pump such as a turbo-molecular pump, and is capable of evacuating the protective film formation chamber 128.

The protective film formation chamber 128 includes voltage application means for changing the potential of the substrates 1. The substrates 1 held, by the holder of the carrier 10 are electrically connected to the holder via claws (plate springs), and the holder is insulated from each discharge electrode 831 (discharge electrode part). Thus, changing the potential of the holder can change the potential of the substrates 1. The voltage application means is a device configured to bring an electrode connected to a substrate voltage application power source 834 or the ground into contact with the holder. Potential applied, to the holder may be appropriately selected from a DC power source, a pulse power source, a high-frequency power source, and the like, other than the ground potential.

The protective film formation chamber 128 includes a gas introduction part 62 (gas introduction device) as a gas introduction system configured to introduce a process gas containing a source gas, and a plasma formation part 83 (power source part) configured to form plasma by giving energy to the introduced process gas and applying power between the substrate 1 and the discharge surface of the discharge electrode 831. The gas introduction part 82 con introduce, as a proceed gas, a hydrocarbon gas or a mixture gas of a hydrocarbon gas and an Ar, Ne, Kr, Xe, hydrogen, or nitrogen gas, at a predetermined flow rate. The gas introduction part 82 has a gas supply source such as a gas cylinder, a mass flow controller (MFC) configured to control how much the gas supplied from the gas supply source should be introduced, a gas introduction member configured to introduce the gas into the vacuum vessel, and gas tubes through which the gas flows among these members. In this embodiment, supports 841 to be described later function also as the gas introduction member.

Each plasma formation part 83 forms plasma by causing high-frequency discharge in the process gas introduced. Main components of the plasma formation part 83 include the discharge electrode 831 provided inside the protective film formation chamber 128 and a discharge power supply 833 configured to supply high-frequency power to the discharge electrode 831 via a matching box 832. The discharge electrode 831 is hermetically connected to the protective film formation chamber 128 with an insulating block 836. The discharge power source 833 can supply a high-frequency power of 13.56 MHz, for example, to the discharge electrode 831.

The discharge electrode 831 is made of metal inside, and is made of carbon at its surface (a discharge surface) being exposed, to the inside of the chamber and facing the substrate. Permanent magnet 835 (a magnet unit) is provided inside the discharge electrode 831. A shield 837 and a no-erosion-portion mask 838 (a mask part) are provided around the discharge electrode 831. The shied 837 surrounds the discharge electrode 831 and is at ground potential. The no-erosion-portion mask 838 covers the substrate side of the discharge electrode 831, is at ground potential, and is in parallel to the discharge surface of the discharge electrode 831. Note that each permanent magnet 835 is configured to produce a magnetic field locally in the surface (discharge surface) of the discharge electrode 831, and only has to be located on the back side of the discharge surface of the discharge electrode 831 (the side of the discharge surface opposite to the substrates). For example, the permanent magnets 835 may be provided on the back side of the discharge electrode 831.

Herein, areas on the discharge electrode 831 where erosion is caused, by the magnetic fields produced by the permanent magnets 835, i.e., portions where no DLC film is deposited are called areas eroded (erosion areas, erosion portions), and a portion where the magnetic fields are weak and a DLC film is deposited is called an area not eroded (a no-erosion area, a no-erosion portion). The erosion portions are locations where strong plasmas are generated by parallel magnetic fields produced on the discharge surface by the permanent magnets 835. The no-erosion portion is an area where relatively weak plasma is generated because no parallel magnetic field is produced on the discharge surface.

Each permanent magnet 835 includes an annular first magnet placed inside and a second magnet surrounding the first magnet. The first magnet is arranged such that one of two magnetic poles faces the discharge surface, and the second magnet is arranged such that the magnetic pole opposite to that of the first magnet faces the discharge surface. The first magnet and the second magnet are fixed with a yoke (not shown) to form the permanent magnet 835. The yoke may have a flat shape, or for example, part of the yoke may have a projecting portion filling a space between the first magnet and the second magnet.

The erosion portions of the discharge electrode 831 are exposed to a discharge space inside the protective film formation chamber 128. The no-erosion portion is covered by the no-erosion-portion mask 838 (mask part) and shielded from she discharge space inside the protective film formation chamber 128. The no-erosion portion is an area of the discharge electrode 831 which faces a portion outside of where the permanent magnets 835 are placed, or more specifically, the no-erosion portion, is formed at the discharge surface side of the discharge electrode 831 at an area facing a portion outside the second magnets. In this embodiment, the no-erosion-portion mask 838 is provided to surround the areas of the discharge surface which face the magnet units. In other words, the no-erosion-portion mask 838 is provided to cover portions of the discharge surface side of the discharge electrode 831, the portions facing areas outside at least the outer edges of the second magnets. Alternatively, the no-erosion-portion mask 838 may be configured to cover a portion of the discharge surface of the discharge electrode 831, the portion facing an area outside the inner edges of the second magnets. As described above, the no-erosion-portion mask 838 is configured to cover a portion of the discharge surface side of the discharge electrode 831, the portion facing an area outside at feast the outer edges of the second magnets. Thus, in other words, the no-erosion-portion mask 838 has openings the diameter of which is equal to or smaller than the outer periphery of the second electrode. The size and shape of each of these openings are determined according to tire dimensions of the no-erosion portions formed at the discharge electrode 831 at areas facing the second magnets.

The area and shape of each erosion portion are determined by the film-thickness distribution and the film formation rate of the protective film formed on the substrate 1. Near the inner peripheral hole of the substrate 1, the film thickness fends to be uneven, and the film formation rate tends to increase. For this reason, it is desirable to generate annular plasma having low plasma density at the center. The annular plasma can be generated by adjusting the arrangement and shape of the permanent magnets 835 or the shape of the erosion portions exposed. It is preferable that the discharge electrode 831 and the no-erosion-portion mask 838 covering the discharge electrode 831 and being at ground potential should not be in contact with each other and have an interspace therebetween just enough not to generate plasma therebetween. For example, the interspace between the discharge electrode 831 and the no-erosion-portion mask 838 cover lag the discharge electrode 831 is preferably 3 mm or smaller.

In this embodiment, each erosion portion has a circular or annular shape, but if quadrangular permanent magnets (especially second magnets) are used, a long annular erosion portion is generated. In this case, the no-erosion-portion mask 838 is provided to cover a portion of the substrate side of the discharge electrode 831, the portion facing an area outside the second magnets. If the magnet unit includes many permanent magnets whose magnetic poles are alternately arranged, the erosion portions are generated in inside portions surrounded by the areas where these permanent magnets are arranged (the areas where the magnet units are placed). Also in this case, the no-erosion-portion mask 838 is provided to cover portions of the discharge surface which face areas outside of where the permanent magnets (the magnet units) are arranged, or more specifically, outside the second magnets.

The no-erosion-portion mask 838 covering the discharge electrode 831 is fixed, with a screw (not shown), to the shield 837 which is at ground potential and covers the electrode body or the electrically grounded support which penetrates the discharge electrode 831. A metallic material such as Al or SUS can be used as the no-erosion-portion mask 838. In a case where the carrier 10 used is capable of holding multiple substrates as in this embodiment, the no-erosion-portion mast 838 is configured to expose multiple erosion portions. Isolating plasma of each erosion portion makes the plasma uneven, and makes the film thickness or the film thickness distribution vary greatly between the substrates. Thus, the no-erosion-portion mask 838 covering the discharge surface is formed into such a shape that plasmas produced by the multiple erosion portions may be continuous with each other. For example, it is preferable that the thickness of the no-erosion-portion mask 838 covering the discharge electrode 831 should be 35 mm or smaller.

A plasma blocking shield 839 can be provided between the no-erosion-portion mask 838 and the carrier 10. The plasma blocking shield 839 has openings each of a size about the same or larger than the maximum width of the substrate 1 held by the carrier 10. It is preferable that, the clearance between the plasma blocking shield 839 and the substrate carrier 10 is 5 mm or smaller.

The potential state of the no-erosion-portion mask 838 or the plasma blocking shield 839 is not limited to the ground potential as long as high-frequency voltage or negative DC voltage is not applied thereto. For example, floating voltage or positive DC voltage may be applied to them. As long as high-frequency voltage or negative DC voltage is not applied to the no-erosion-portion mask 838, a DLC film having high internal stress and easily peeling off is not deposited since ions are not accelerated toward the film deposited on the shield.

The plasma blocking shield 839 can prevent plasma from spreading to the conveyance mechanism side. By including the no-erosion-portion mask 838 and the plasma blocking shield 839, the protective film formation chamber 128 can confine plasma in a space (discharge space) between the no-erosion-portion mask 838 and the plasma blocking shield 839. Thus, an area in the protective film formation chamber 128 where a DLC film is deposited can be reduced, allowing suppression of generation of particles even more. Here, the surfaces of the no-erosion-portion mask 838 and the plasma blocking shield 839 inside the protective film formation chamber 128 are preferably subjected to a surface treatment of at least one of alumina sandblasting and aluminum arc spraying, and it is more preferable that they are then embossed. These surface treatments allow prevention of DLC film peeling and suppression of particle generation.

Each permanent magnet 835 may be configured of a permanent magnet or a combination of a permanent magnet and a yoke, and may be configured with at least one of an annular shape, an elliptical shape, and a polyangular shape. A permanent magnet made of neodymium, samarium-cobalt (SmCo), or the like can be used as the permanent magnet 835. A stainless steel material can be used for a casing of the permanent magnet 835. In this embodiment, as shown in FIG. 2, multiple annular SmCo magnets are arranged inside the discharge electrode 831 and fixed with a screw (not shown).

Since the magnets are heated when high-frequency power is high, the magnets may be cooled. Particularly when magnets having a low Curie point are used, it is preferable to have a mechanism for cooling the magnets. The cooling mechanism may be configured to cool the magnets by, for example, causing cooling water to flow inside the discharge electrode 831, or housing the magnet case in a cooling container and causing coolant, such as water, to flow through the container. In the canoe using the cooling container, the magnet case itself may be configured to function as the above container, and the coolant may be circulated inside the case.

In the protective film formation chamber 128, the evacuation system 81 evacuates the protective film formation chamber 128 to a predetermined pressure, and the gas introduction system 82 introduces a process gas at a predetermined flow rate. In this embodiment, a mixture gas of ethylene and hydrogen is introduced. The substrate 1 is stopped at the position shown in FIG. 2, held by the carrier 10. In this state, the discharge power supply 833 applies high-frequency voltage to she discharge electrode 831. As a result, a high-frequency magnetic field is set in an opposite space, and high-frequency discharge is caused in the process gas, forming plasma of the process gas. Further, the voltage application means (the substrate voltage application power source 834) applies voltage to the substrates 1 during the film formation, thereby forming a DLC protective film on the substrate 1.

The permanent magnet 835 is adjusted so that the erosion portion of the discharge electrode 831 of the protective film formation chamber 128 may have an annular shape adjusted to the opposite position of the substrate 1. Thus, the no-erosion-portion mask 838 covering the discharge electrode 831 may be divided into an inner mask (a second mask part) covering the no-erosion portion formed in an inside portion surrounded by the annular erosion portion and an outer mask (a mask part) covering the no-erosion portion formed outside the annular erosion portion. This configuration of the no-erosion-portion mask 838 divided into the inner and outer masks will be described in detail in Example 2.

Characteristics of this embodiment are described. This embodiment is characteristic in its configuration in which the permanent magnets 835 are provided inside the discharge electrode 831 to generate magnetic fields locally at the surface of the discharge electrode 831, and the no-erosion-portion mask 383 covers the surface of the no-erosion portion of the discharge electrode 831 formed by the permanent magnets 835. In addition, this embodiment is characteristic in its configuration in which the erosion portions of the discharge electrode 831 formed by the permanent magnet 835 are exposed, for discharge, to the discharge space in the protective film formation chamber 128. A DLC film is not deposited on the exposed surface of the discharge electrode 831 by making the sputtering rate for the erosion portion higher than the rate of deposition of the DLC film on the exposed surface of the discharge electrode 831.

Here, a description is given of a mechanism of preventing deposition of a DLC film on the discharge electrode 831, according to this embodiment. When high-frequency voltage is applied to the discharge electrode 831, negative DC voltage called self-bias voltage is generated in the discharge electrode 831. This self-bias voltage accelerates ions in the plasma to cause ion bombardment, which sputters the electrode material of the discharge electrode 831.

In a vacuum treatment apparatus not having the configuration of this embodiment, a DLC film is deposited on an exposed area of a discharge electrode because the rate of DLC film deposition is higher than the rate of sputtering by the self-bias voltage. By the ion bombardment, the DLC film deposited on the discharge electrode may become a hard DLC film having a high internal stress. When the deposition amount of the hard DLC film increases, the hard DLC film easily peels off, generating carbon particles in the protective film formation chamber.

By placing a permanent magnet inside the discharge electrode and thereby causing a magnetic field locally at the discharge surface, an effect of sputtering at the discharge surface can be enhanced. Since erosion takes place at a portion corresponding to a parallel magnetic field, a magnet which enlarges the parallel magnetic field and increasing the erosion portion is needed. However, it is industrially difficult to employ a permanent magnet which makes the rate of DLC film deposition higher than the sputtering rate, evenly for the discharge surface.

Thus, in this embodiment, in order for a DLC film not to be deposited on the discharge electrode 831, a portion where the rate of DLC film deposition is higher than the sputtering rate and the no-erosion portion are covered with the no-erosion-portion mask 838. A DLC film deposited on the no-erosion-portion mask 838 is a soft DLC film having a low interned stress, and is hard to peel off even if the amount of deposition thereof increases. Employment of an optimum erosion shape which satisfies corrosion resistance and productivity as in this embodiment can reduce generation of particles in the protective film formation chamber due to DLC film peeling even without performing a DLC film removal process of oxygen-plasma cleansing.

Figure 3:
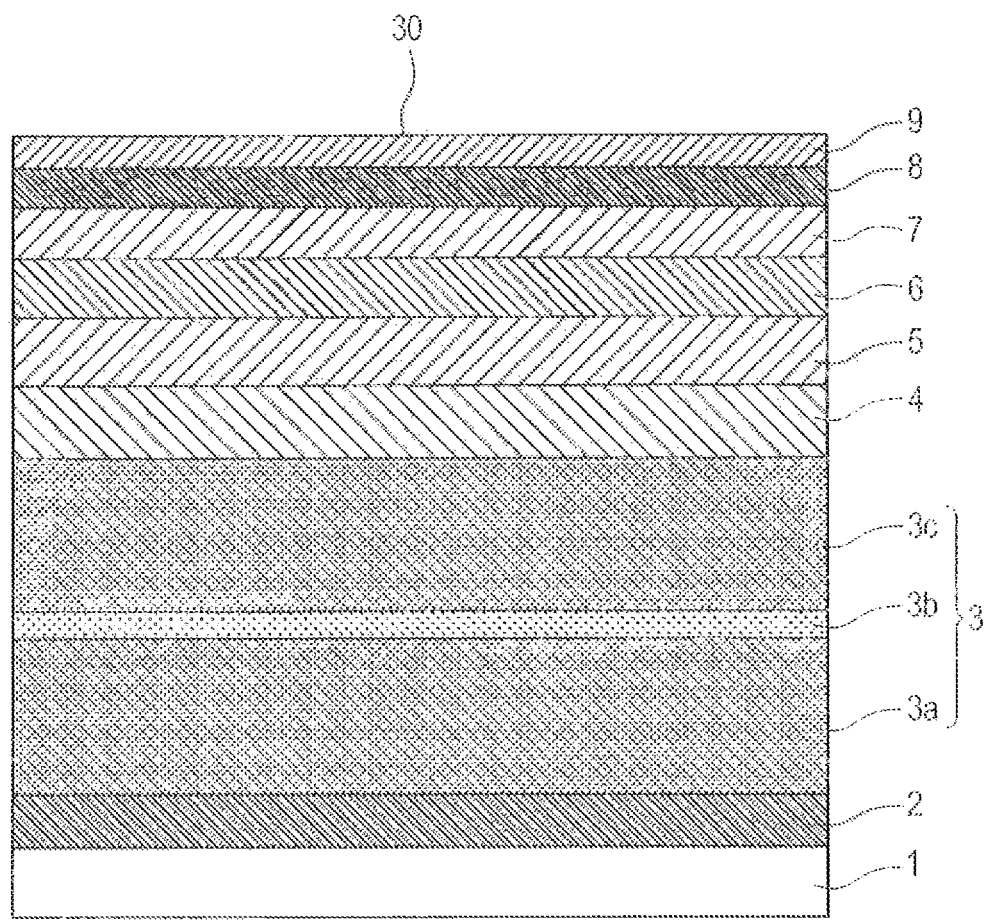
FIG. 3 is a sectional view showing the layer configuration of a perpendicular magnetic recording medium on which the layers have been formed by the vacuum treatment apparatus of the present invention.

FIG. 3 is a schematic sectional view of a magnetic recording medium manufactured by the vacuum treatment apparatus of this embodiment. With reference to FIG. 3, a description is given of the layer configuration of a perpendicular magnetic recording medium 30. The perpendicular magnetic recording medium 30 has, on each surface of the non-magnetic substrate 1, an adhesion layer 2, a soft magnetic layer 3, a seed layer 4, an intermediate layer 5, magnetic recording layers 6 and 7, and a DLC protective film 8. A lubricant film 9 is preferably formed on the protective film 8. Although the above layers of the magnetic recording medium are formed on each surface of the substrate 1 (non-magnetic substrate), FIG. 3 shows the layers on one surface only.

A description is given below of layers of the magnetic recording medium above, except for the protective film 8 and the lubricant film 9. A non-magnetic rigid substrate can be used as the substrate 1, the substrate being made of, besides soda lime glass, chemically-strengthened aluminosilicate, an Al—Mg alloy substrate formed by electroless nickel-phosphorus plating, silicon, ceramics including boron silicate glass or the like, ceramics subjected to glass glazing, or the like.

The adhesion layer 2 is a layer for preventing alkali metal from electrochemically eluting from the soda lime glass, as well as for improving the contact between the glass and the soft magnetic layer 3, and may have any selected thickness. Materials usable for the adhesion layer 2 include AlTi, AlTa, NiTa, CoTiAl, and the like. If not particularly necessary, the adhesion layer 2 may be omitted.

The soft magnetic layer 3 is formed by a lower soft magnetic layer 3a, an antiferromagnetic coupling induction layer 3b, and an upper soft magnetic layer 3c stacked in the order mentioned. A laminate of FeCo alloys, FeTa alloys, Co alloys, or the like and Ru alloys or the like can be used for the soft material layer 3. For the seed layer 4, a laminate of NiW alloys, NiFe alloys, NiTa alloys, TaTi alloys, or the like can be used. A laminate of Ru or Ru alloys can be used for the intermediate layer 5.

For the magnetic recording layers 6 and 7, CoCr-based alloys such as CoCrPt alloys, a material obtained by including ferromagnetic particles of CoPt or the like in an oxide-based material such as SiO2 in a matrix manner, or a laminate of these can be used.

In a case of performing a substrate cooling step during manufacture of the vertical magnetic recording medium 30, the step may be performed after or before the upper soft magnetic layer 3c is formed, or before the magnetic recording layer 6 is formed. Alternatively, the cooling step may be performed in multiple parts at these timings. If unnecessary, the cooling step may be omitted, of course.

The layer configuration of the magnetic recording medium shown in FIG. 3 is an example, and it goes without saying that other magnetic recording media can also be manufactured. Examples of the other magnetic recording media manufactured by the vacuum treatment apparatus of the present invention include an energy-assisted type magnetic recording medium such as a bit patterned medium, thermal-assisted magnetic recording medium, and a medium for microwave-assisted magnetic recording medium.

Examples belonging to the embodiment above are described below. Note that the present invention is not limited to the examples below, and can be appropriately changed as long as the spirit thereof is not changed,

EXAMPLE 1

Figure 4:
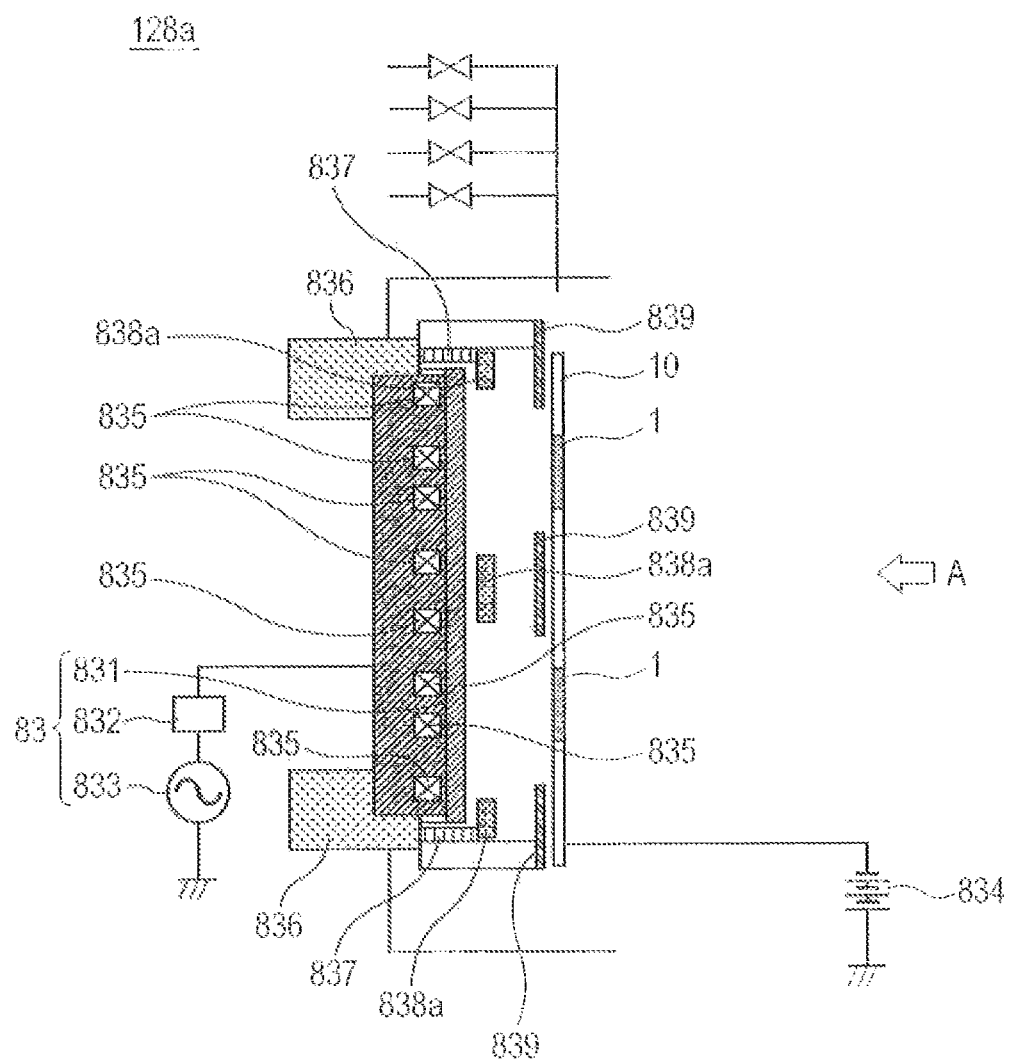
FIG. 4 is a schematic sectional view showing part of a protective film formation chamber of Example 1.
Figure 5:
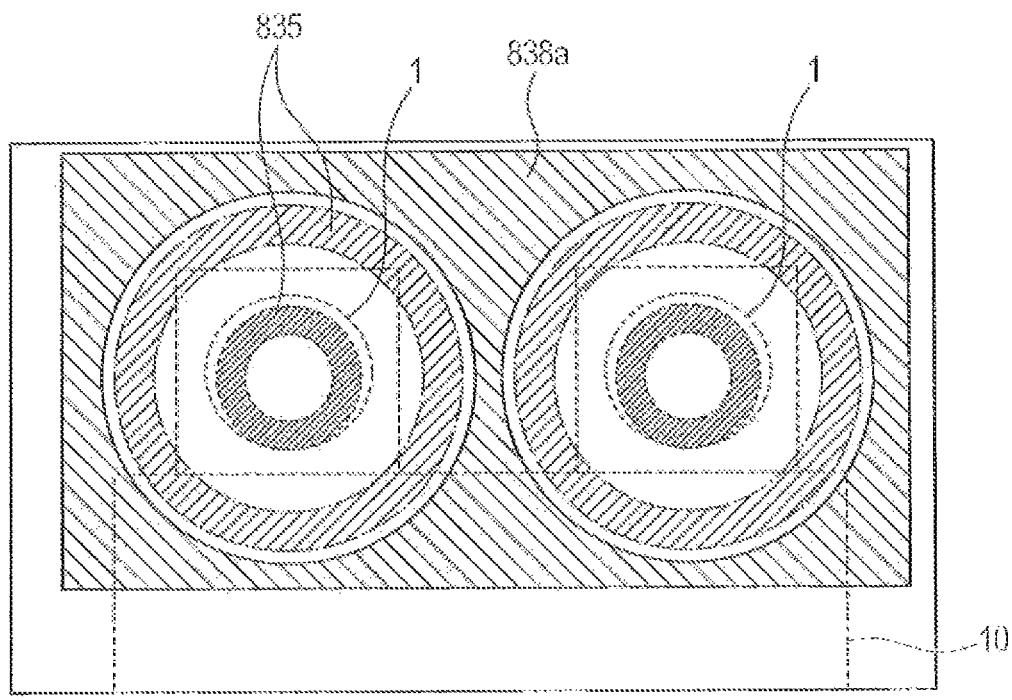
FIG. 5 is a schematic view of a no-erosion-portion mask seen in direction A in FIG. 4.

FIG. 4 shows the configuration of a protective film formation chamber 128a of Example 1, FIG. 4 shows an area corresponding to the left half of FIG. 2, enlarged. In the following description provided with reference to FIG. 4, only a configuration characteristic of Example 1 is described. FIG. 5 is a schematic vie of a no-erosion-portion mask 838a seen in direction A in FIG. 4. Configurations similar to ones described with FIG. 1 are given the same reference numerals and are not described again here.

Each erosion portion of the discharge electrode 831 of the protective flim formation chamber 123a has a circular shape adjusted to a position facing the substrate 1, and has a diameter of 140 mm. The no-erosion-portion mask 838a covering such discharge electrode 831 is fixed, with a screw (not shown), to the shield 837 surrounding the electrode body and being at ground potential. The thickness of the member used as the no-erosion-portion mask 838a is 10 mm, and the interspace between the discharge electrode 831 and the no-erosion-portion mask 838a is 2 mm. The no-erosion-portion mask 838a is provided to cover a portion of the substrate side of the discharge electrode 831, the portion facing an area outside she outer edges of the second magnets. The diameter of each opening portion of the no-erosion-portion mask 838a of Example 1 is almost equal to the outer diameter of the second magnet.

The permanent magnets 835 are embedded inside a water-cooled Cu electrode of the discharge electrode 831, and are away from the electrode surface by 9 mm. Each permanent magnet 835 has a double-ring. An outer permanent magnet (second magnet) has its north pole facing the electrode surface and its south pole facing the back surface of the electrode, and an inner permanent magnet (first magnet) has its south pole facing the electrode surface and its north pole facing the back surface of the electrode. The outer permanent magnet and the inner permanent magnet have diameters of 162 mm and 54 mm, respectively, and are 10-mm thick. SmCo magnets are used as the permanent magnets. Since the protective film formation chamber 128a is configured to be capable of treating two substrates at once, the no-erosion-portion mask 836a has two openings provided at positions corresponding to the two substrates 1, and each pair of the first and second magnets is provided to coincide with its corresponding opening portion.

The plasma blocking shield 839 is provided between the no-erosion-portion mask 838a and the carrier 10. The plasma blocking shield 839 has opening portions each of which has a diameter of 120 mm, and the clearance (inter-space) between the plasma blocking shield 839 and the substrate carrier 10 is 5 mm or smaller. The surface of the no-erosion-portion mask 838a has been subjected to embossing and also aluminum arc spraying. The plasma blocking shield 839 and the shield 837 have been subjected to alumina sandblasting.

A description is given of a method for manufacturing a magnetic recording medium using the vacuum treatment apparatus of Example 1. On each side of each substrate 1 which is a glass substrate (having an outer diameter of 65 mm, an inner diameter of 15 mm, and a thickness of 0.8 mm), a 5-nm-thick adhesion layer 2 made of NiTa, a 20-nm-thick lower soft magnetic layer 3a made of FeCo-TaZr alloys, a 0.5-nm-thick antiferromagnetic coupling induction layer 3b made of Ru alloys, a 20-nm-thick upper soft magnetic layer 3c made of FeCoTaZr alloys, an 8-nm-thick seed layer 4 made of NiW, a 15-nm-thick intermediate layer 5 made of Ru, a 18-nm-thick magnetic recording layer 6 which is a granular magnetic layer made of CoCrSiO2 alloys, and a 7-nm-thick magnetic recording layer 7 which is a magnetic layer made of CoCrPtB are stacked in the order mentioned. Next, the non-magnetic substrates 1 fitted to the carrier 10 is conveyed into the protective film formation chamber 128a, where a DLC protective film 8 is formed on both surfaces of the non-magnetic substrates on which the magnetic layers have been formed. The in-line apparatus (vacuum treatment apparatus) shown in FIG. 1 is used to form the above layers. The above alloy layers are each formed by preparing an alloy target having the same composition as a desired film composition, and subjecting the target to DC magnetron sputtering.

While the protective film formation chamber 128a is being evacuated by a turbo-molecular pump, 50 sccm of an ethylene gas which is a source gas and 15 sccm of a hydrogen gas are introduced to the protective film formation chamber 128a at the same time. Although a mixture gas of a hydrocarbon gas and a hydrogen gas is used as an introduction gas for the protective film formation chamber 128a in Example 1, the present invention is not limited to this. A hydrocarbon gas or a mixture gas of a hydrocarbon gas and a gas of at least one of Ar, Ne, Kr, Xe, hydrogen, and nitrogen may be used. When 0.5 second passes after the gas is started to be introduced, a high-frequency power of 1000 W is applied to the discharge electrode 831, causing discharge to generate plasma in the mixture gas. Then, to form a hard DLC protective film, a bias voltage is applied to each substrate 1. Specifically, a bias voltage of −250 V is applied to the substrates 1 by bringing a substrate bias application electrode into contact with an end surface of she substrate 1, the electrode being made of Ni alloys, being at ground potential, and being insulated from the discharge electrode 831. A bias current to the substrate 1 side is about 0.6 A total, including what is retained by the substrate 1. By adjusting the duration to retain the plasma, a 3.0-nm-thick DLC protective film 8 being made of mainly carbon and containing hydrogen and nitrogen is formed. The pressure inside the protective film formation chamber 128*a* is 1.5 Pa. Then, the magnetic recording medium on which the DLC protective film 8 is formed is discharged from the protective film formation chamber 128*a*.

EXAMPLE 2

Figure 6:
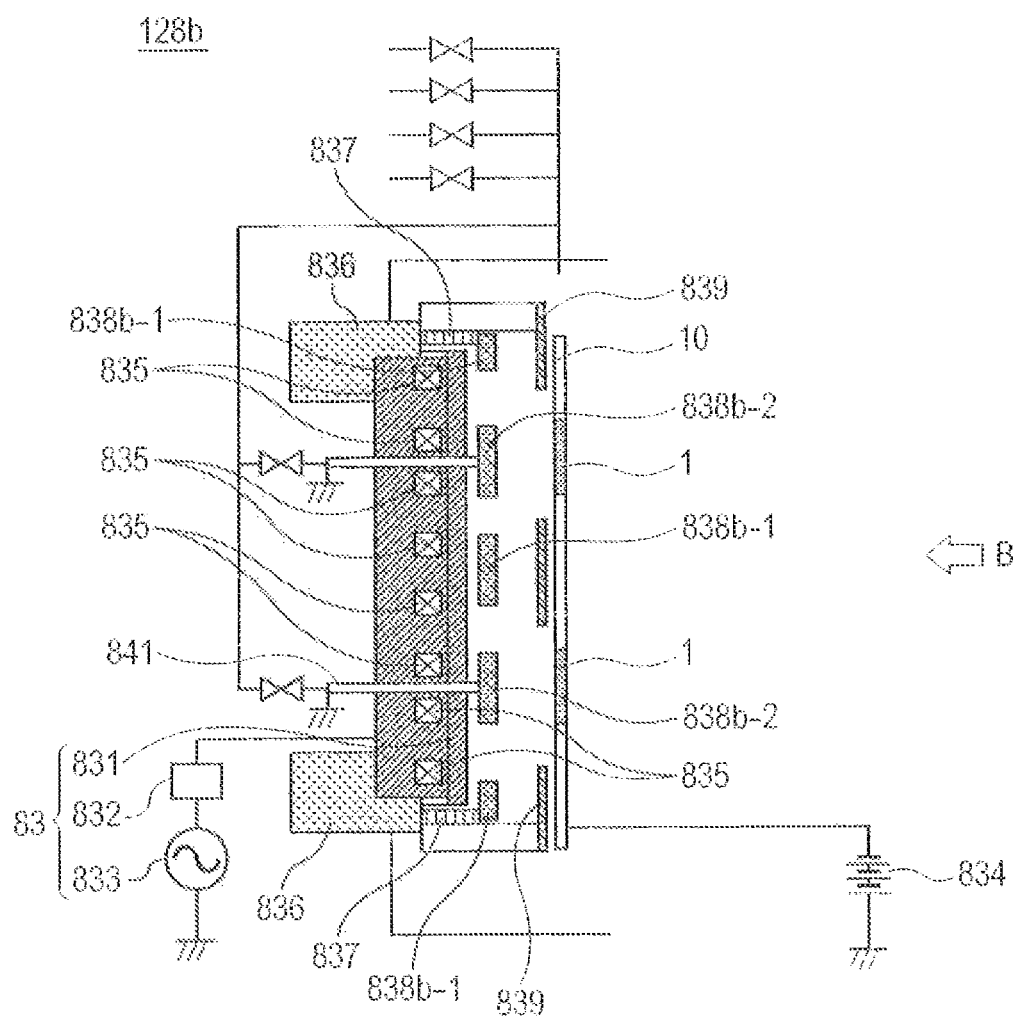
FIG. 6 is a schematic sectional view showing part of a protective film formation chamber of Example 2.
Figure 7:
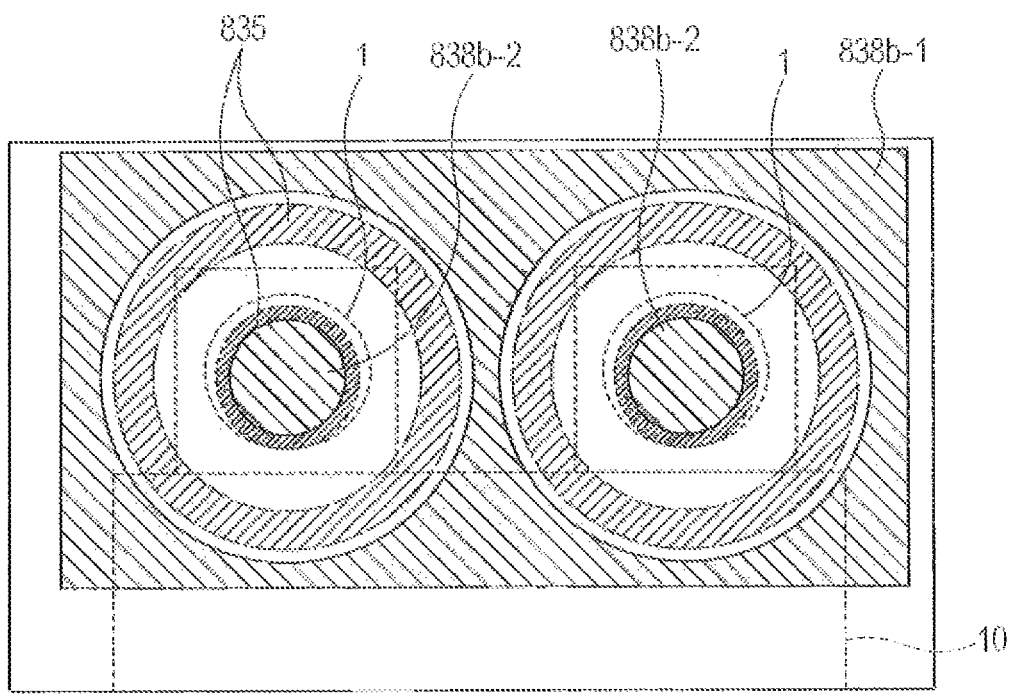
FIG. 7 is a schematic view of a no-erosion-portion mask seen in direction B in FIG. 6.

FIG. 6 shows the configuration of a protective film formation chamber 128*b* of Example 2. FIG. 6 shows an area corresponding to the left half of FIG. 2, enlarged. In the following description provided with reference to FIG. 6, only a configuration characteristic of Example 2 is described. FIG. 7 is a schematic view of a no-erosion-portion mask 838*b* (838*b*-1 and 838*b*-2) seen in direction B in FIG. 6. Configurations similar to ones described with FIG. 1 are given the same reference numerals a so are not described again here. Each erosion portion of the discharge electrode 831 of the protective film formation chamber 126*b* has an annular shape adjusted to a position facing the substrate 1, and has an outer diameter of 140 mm and an inner diameter of 70 mm.

In the no-erosion-portion mask 838*b* covering such discharge electrode 831, the outer mask 838*b*-1 (mask part) covering the no-erosion portion located outside the 140-mm-diameter erosion portions is a flat plate having two circular openings each slightly larger than the outer diameter (140 mm) of the erosion portion, and covers the outer no-erosion portion. The outer mask 838*b*-1 (mask part) was fixed, with a screw (not shown), to the shield 837 surrounding the discharge electrode 831 and being at ground potential. Further, each inner mask 838*b*-2 (second mask part) covering the no-erosion portion inside the inner diameter (70 mm) of the erosion portion is a circular plate shield leaving a thickness of 2 mm and a diameter of 70 mm, and is fixed, with a screw (not shown), to the electrically-grounded support 841 penetrating the discharge electrode 831. Since the support 841 penetrating the discharge electrode 831 supports the no-erosion-portion mask 838*b*-2, the no-erosion-portion mask 838*b*-2 can be fixed and provided in an inside portion surrounded by a ring-shaped erosion portion, without an interconnection or a shield crossing over the erosion portion.

Each support 841 is formed of a tubular member, and a process gas is introduced into the vacuum vessel through the inside of the support 841. Being located at the center of the discharge electrode 831 (the center of the annular erosion portion), she support 841 can supply a process gas to each part of the erosion portion at an even pressure. The inner mask 838*b*-2 of Example 2 is provided to cover at least the surface side of the discharge electrode 831 at an area facing an inside portion surrounded by the inner ring-shaped magnet (first magnet) of the permanent magnet 835. The dimension of the inner-mask 838*b*-2 is determined according to the dimension of each no-erosion portion formed at the discharge electrode 831 at an area corresponding to the first magnet. For example, the inner mask 836*b*-2 may be a circular plate diameter equal to or larger than the outer diameter of the first magnet.

EXAMPLE 3

Figure 8:
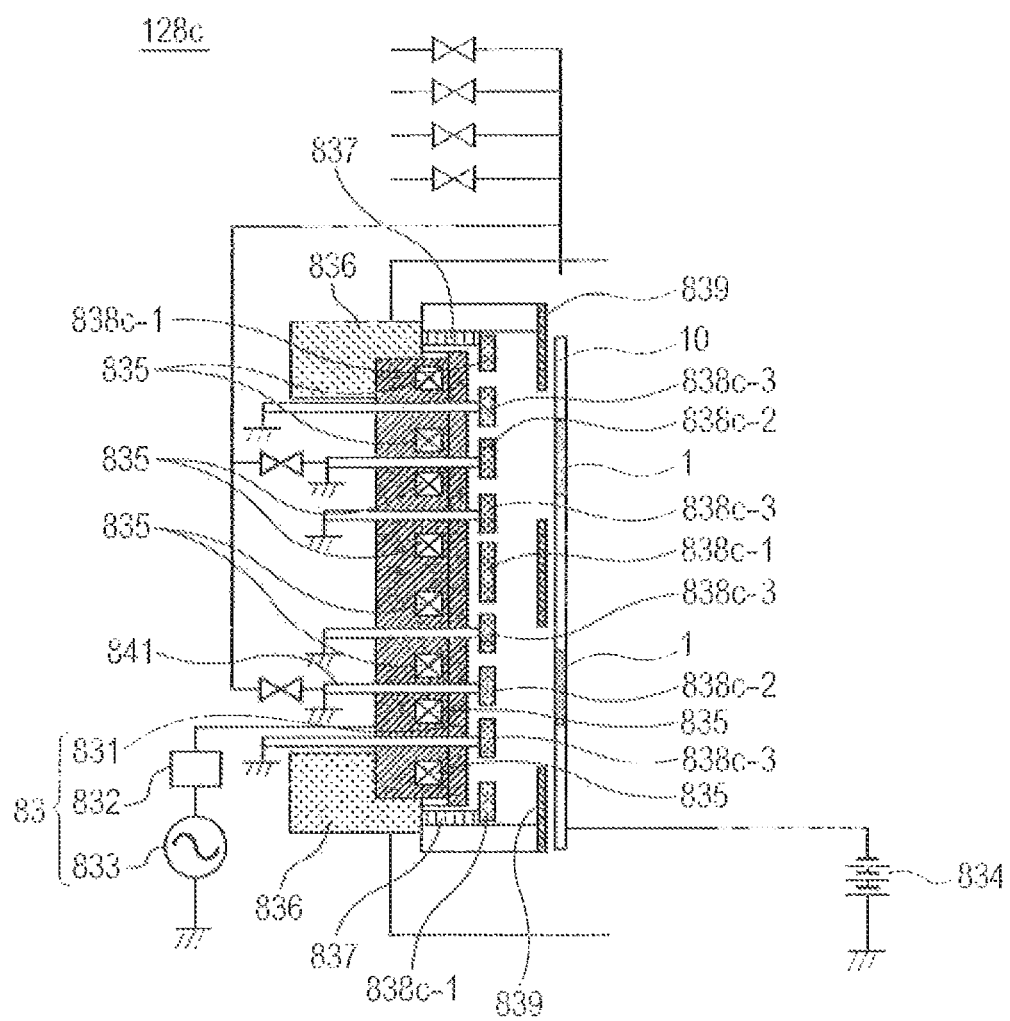
FIG. 8 is a schematic sectional view showing part of a protective film formation chamber of Example 3.

FIG. 8 shows the configuration of a protective film formation chamber 128*c* of Example 3. FIG. 8 shows an area corresponding to the left half of FIG. 2, enlarged. In the following description provided with reference to FIG. 8, only a configuration characteristic of Example 3 is described. Configurations similar to ones described with FIG. 1 are given the same reference numerals and are not described again here. Each erosion portion of the discharge electrode 831 of the protective film formation chamber 128*c* has a double-ring shape adjusted to a position facing the substrate 1. The outer and inner circles of an outer ring of the erosion portion have diameters of 140 mm and 110 mm, respectively, and the outer and inner circles of an inner ring of the erosion portion have diameters of 90 mm and 70 mm, respectively.

A no-erosion-portion mask covering such discharge electrode 831 is divided into three portions. A no-erosion-portion mask 838*c*-1 (mask part) covers a no-erosion portion located outside the 140-mm-diameter erosion portions, and is fixed, with a screw (not shown), to the shield 837 surrounding the electrode body and being at ground potential. Each no-erosion-portion mask 838*c*-2 (second mask part) covers a portion inside the inner diameter (70 mm) of the inner ring of the erosion portion, and is fixed, with a screw (not shown), to the electrically-grounded support 841 penetrating the discharge electrode 831. A third mask part 838*c*-3 is provided between the mask part 838*c*-1 and each second mask part 838*c*-2. The configurations of the mask part 838*c*-1 and the second mask parts 838*c*-2 are similar to those of the mask part 838*b*-1 and the second mask parts 838*b*-2 of Example 2 described earlier.

Each third mask part 838*c*-3 is provided at a position (intermediate position) between the mask part 838*c*-1 and the second mask part 838*c*-2, and covers a no-erosion portion formed at this position. It is usually unlikely that a no-erosion portion is formed at the position (intermediate position) between the mask part 838*c*-1 and the second mask part 838*c*-2. However, if, for example, another permanent magnet or a yoke is placed between the first magnet and the second magnet, a no-erosion portion might be formed at this intermediate position. The innermost second mask parts 838*c*-2 are circular, and the third mask parts 838*c*-3 located outside them are annular. Each support 841 is a tubular member, and a process gas is introduced into the vacuum vessel through the inside of the support 841.

(Evaluations of Magnetic Recording Media)

A corrosion resistance test and a metal contamination measurement were performed on the magnetic recording media of Examples 1 to 3. The corrosion resistance rest was performed under the following conditions. The magnetic recording media were left untouched for four days in a temperature and humidity testing chamber having a temperature of 75° C. and a relative humidity of 90%. After the four days, the magnetic recording media were taken out of the tank which had been under the above temperature and humidity environment. Then, the number of corrosion count on the surface of each magnetic recording medium taken out was measured by use of an optical surface analyzer (OSA). It has been experimentally found that a magnetic recording medium has sufficient corrosion resistance to be used for a hard disk drive if the number of corrosion count thereon measured in this test is about 100 or less. Table 1 shows results of this evaluation. It could be confirmed from Table 1 that the magnetic recording media fabricated by the manufacturing apparatus and manufacturing method of the present invention had favorable corrosion resistance.

TABLE 1

Results of Corrosion Test

|  | Example 1 | Example 2 | Example 3 |
|---|---|---|---|
| Corrosion Count (count/surface) | 70 | 57 | 63 |

For the measurement of metal contamination in a protective film, a secondary ion mass spectrometer was used, and results were normalized to a measurement result of a metal electrode. Elements measured were Mg, Al, and Fe, which are typical elements included as impurities. These are constituent elements of a metal electrode material conventionally used for an electrode in the protective film formation chamber 128 (128*a*, 128*b*, 128*c*). Table 2 shows results of this evaluation. It could be confirmed from Table 2 that the magnetic recording media fabricated by the manufacturing apparatus and manufacturing method of the present invention were contaminated by almost no metal impurities.

TABLE 2

Results of Metal Contamination Analysis

|  | Example 1 | Example 2 | Example 3 |
|---|---|---|---|
| Metal Contamination Ratio | 0.07 | 0.10 | 0.15 |

What is claimed is:

1. A plasma CVD apparatus comprising: a vacuum vessel; a gas introduction part configured to introduce a process gas to the vacuum vessel; a holder configured to hold a substrate; a discharge electrode part having a discharge surface at a position facing the substrate conveyed to a predetermined position in the vacuum vessel; a plasma formation part configured to form plasma between the discharge surface and the substrate conveyed to the predetermined position; a magnet unit being provided at a back side of the discharge surface and having a first magnet provided such that a certain one of magnetic poles thereof faces the discharge surface and a second magnet provided such that a magnetic pole opposite to the certain magnetic pole of the first magnet faces the discharge surface, the first magnet being annular, the second magnet surrounding an outer side of the first magnet; a first mask part, which is a first plate having an opening, provided between the discharge surface and the substrate, and being placed in parallel to the discharge surface; a second mask part, which is a second plate, provided in parallel to the discharge surface in the opening of the first mask part, filling at least a part of a center portion of the opening, and separated from the first mask part, the second plate covering the discharge surface facing an area on which the first magnet is placed; and a plasma blocking shield placed between the holder and the first and/or second mask part, wherein a discharge space is confined between the first and second mask parts and the plasma blocking shield, and wherein the discharge surface of the discharge electrode part is exposed to the discharge space through an area of the opening of the first mask part except for an area of the opening of the first mask part filled with the second mask part.

2. The plasma CVD apparatus according to claim 1, wherein both of the first mask part and the second mask part are at either one of ground potential and floating potential.

3. The plasma CVD apparatus according to claim 1, wherein at least the discharge surface of the discharge electrode part is made of carbon.

4. The plasma CVD apparatus according to claim 1, wherein the second mask is supported by a support penetrating the discharge electrode part.

5. The plasma CVD apparatus according to claim 4, wherein the gas introduction part is connected to the support, and the process gas is introduced into the vacuum vessel through an inside of the support.

6. A vacuum treatment apparatus which, after forming a magnetic film on a substrate, forms a carbon protective film on the magnetic film, wherein the protective film is formed by the plasma CVD apparatus according to claim 1.

7. The plasma CVD apparatus according to claim 1, wherein the first mask part covers the discharge surface facing an area outside an outer edge of the second magnet, and
   the opening and the second mask part are shaped into mutually concentric circles.

8. The plasma CVD apparatus according to claim 1, wherein the area of the opening of the first mask part except for the area of the opening of the first mask part filled with the second mask part is a single ring-shaped area.

9. The plasma CVD apparatus according to claim 1, wherein the discharge electrode part, the plasma formation part, the magnet unit, the first and second mask parts, and the plasma blocking shield are placed symmetrically at both sides of the substrate.

10. The plasma CVD apparatus according to claim 1, wherein the substrate includes plural pieces, and the discharge electrode part, the plasma formation part, the magnet unit, the first and second mask parts, and the plasma blocking shield are placed to process the plural pieces.

11. The plasma CVD apparatus according to claim 1, wherein the magnet unit is placed within the discharge electrode part.

\* \* \* \* \*